United States Patent
Huang et al.

(10) Patent No.: US 10,952,361 B2
(45) Date of Patent: Mar. 16, 2021

(54) SYSTEM AND METHOD FOR DETECTING ELECTRONIC COMPONENTS

(71) Applicant: Delta Electronics, Inc., Taoyuan (TW)

(72) Inventors: Yu-Ru Huang, Taoyuan (TW); Qi-Ming Huang, Taoyuan (TW); Hung-Wen Chen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 25 days.

(21) Appl. No.: 16/539,471

(22) Filed: Aug. 13, 2019

(65) Prior Publication Data

US 2020/0337189 A1  Oct. 22, 2020

(30) Foreign Application Priority Data

Apr. 17, 2019 (CN) .......................... 2019 1 0308449

(51) Int. Cl.
*G06K 9/00* (2006.01)
*H04N 5/232* (2006.01)
*A61B 5/00* (2006.01)
*H05K 13/08* (2006.01)
*H04N 5/225* (2006.01)
*G06T 7/00* (2017.01)

(52) U.S. Cl.
CPC .......... *H05K 13/081* (2018.08); *G06T 7/001* (2013.01); *H04N 5/2256* (2013.01); *H04N 5/23299* (2018.08); *G06T 2207/30141* (2013.01)

(58) Field of Classification Search
CPC ............. H05K 13/081; H04N 5/23299; H04N 5/2256; G06T 7/001
See application file for complete search history.

(56) References Cited

U.S. PATENT DOCUMENTS

| | | | | |
|---|---|---|---|---|
| 2002/0140949 | A1* | 10/2002 | Sasaki | G01N 21/95684 356/606 |
| 2005/0084148 | A1* | 4/2005 | Miranda | G01B 11/024 382/147 |
| 2015/0282714 | A1* | 10/2015 | Mueller | F16M 11/046 348/37 |

* cited by examiner

*Primary Examiner* — Joon Kwon
(74) *Attorney, Agent, or Firm* — Muncy, Geissler, Olds & Lowe, P.C.

(57) ABSTRACT

A system for detecting electronic components includes a light-source device, a photography device, an adjustment device, and an image-processing device. The light-source device generates a light to illuminate at least one pin of a first electronic component at different rotation angles. The photography device senses the light and generates first and second images corresponding to the pin of the first electronic component at different rotation angles. The adjustment device adjusts the photography device and the light-source device to a first height and a second height, wherein the first images correspond to the first height and the second images correspond to the second height. The image-processing device calculates first feature information of the pin of the first electronic component according the first and second images, and analyzes the state of the pin of the first electronic component according to the first feature information.

10 Claims, 9 Drawing Sheets

SYSTEM AND METHOD FOR DETECTING ELECTRONIC COMPONENTS

CROSS REFERENCE TO RELATED APPLICATIONS

This application claims priority of China Patent Application No. 201910308449.7, filed on Apr. 17, 2019, the entirety of which is incorporated by reference herein.

BACKGROUND OF THE INVENTION

Field of the Invention

The present invention relates to a system and method for detecting, and in particular, it relates to a system and method for detecting electronic components.

Description of the Related Art

In the manufacturing process of a conventional printed circuit board (PCB), before the step of inserting electronic components into a circuit board with through-hole technology (THT), the pins of the electronic components need to be straightened, i.e., the pins must be cut to the appropriate length, or bent, so as to allow the electronic components to be accurately inserted into the circuit board.

However, when there are abrasions on the knife tool used to cut a pin, or when the pin straightening is inaccurate, the pins may yaw abnormally, so that the electronic components may not be accurately inserted into the circuit board. Currently, since the pins of electronic components are not generally detected after the automatic operation of pin straightening, it is impossible to know whether the pins of the electronic components are abnormal. Therefore, how to effectively detect the pins of electronic components has become the focus for technical improvements by various manufacturers.

BRIEF SUMMARY OF THE INVENTION

The present invention provides a system and method for detecting electronic components, thereby effectively detecting the state of the pin of the electronic component to serve as the basis for determining whether the pin needs to be corrected.

The present invention provides a system for detecting electronic components, which includes a light-source device, a photography device, an adjustment device and an image-processing device. The light-source device is configured to generate a light to illuminate at least one pin of a first electronic component at different rotation angles. The photography device is disposed in parallel with and opposite to the light-source device. The photography device is configured to sense the light and generate a plurality of first images and a plurality of second images corresponding to the pin of the first electronic component at different rotation angles. The adjustment device is coupled to the photography device and the light-source device. The adjustment device is configured to adjust the photography device and the light-source device to a first height and a second height and rotate the photography device and the light-source device, wherein the first images correspond to the first height and the second images correspond to the second height. The image-processing device is coupled to the photography device. The image-processing device is configured to receive the first images and the second images, calculate first feature information of the pin of the first electronic component according to the first images and the second images, and analyze the state of the pin of the first electronic component according to the first feature information.

In addition, the present invention provides a method for detecting electronic components, which includes the following steps. A light-source device and a photography device are adjusted to a first height, wherein the photography device is disposed in parallel with and opposite to the light-source device. The light-source device and the photography device are rotated, so that a light of the light-source device illuminates at least one pin of a first electronic component at different rotation angles, and the photography device senses the light and generates a plurality of first images corresponding to the pin of the first electronic component at different rotation angles. The light-source device and the photography device are adjusted to a second height. The light-source device and the photography device are rotated, so that the light of the light-source device illuminates at least one pin of the first electronic component at different rotation angles, and the photography device senses the light and generates a plurality of second images corresponding to the pin of the first electronic component at the different rotation angles. First feature information of the pin of the first electronic component is calculated according to the first images and the second images. The state of the pin of the first electronic component is analyzed according to the first feature information.

According to the system and method for detecting the electronic components of the present invention, the light-source device and the photography device are respectively adjusted to the first height and the second height and rotated, so that the light of the light-source device illuminates at least one pin of the first electronic component at different rotation angles. The photography device senses the light and generates the first images and the second images of the pin of the first electronic component corresponding to the different rotation angles. The first feature information of the pin of the first electronic component is calculated according to the first images and the second image, and the state of the pin of the first electronic component is analyzed according to the first feature information. Therefore, the state of the pin of the electronic component may be effectively detected to serve as the basis for determining whether the pin needs to be corrected.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In each of the following embodiments, the same reference number represents an element or component that is the same or similar.

Figure 1:
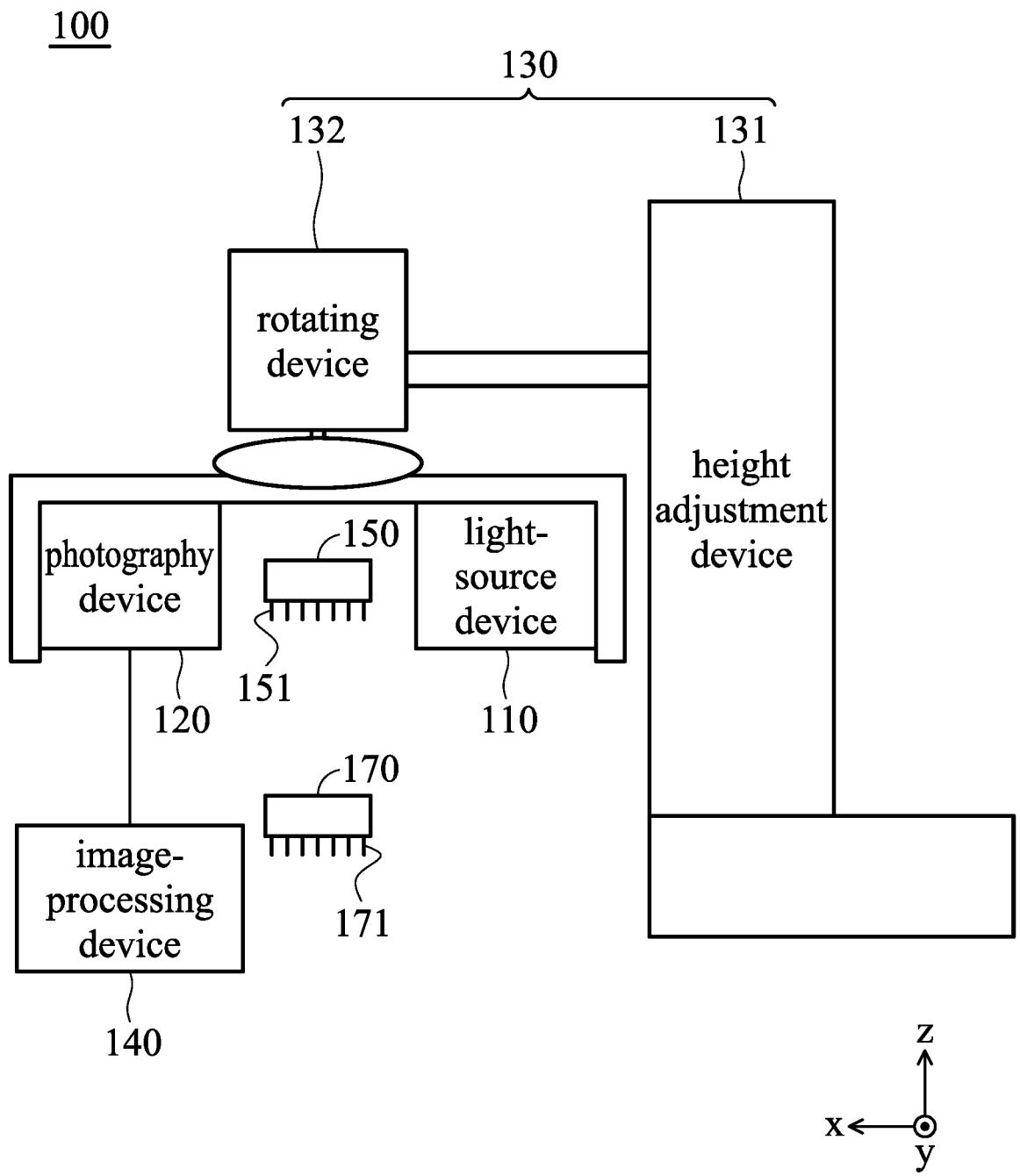
FIG. 1 shows a schematic view of a system for detecting electronic components according to an embodiment of the present invention.

FIG. 1 shows a schematic view of a system for detecting electronic components according to an embodiment of the present invention. Please refer to FIG. 1. The system for detecting the electronic components 100 includes a light-source device 110, a photography device 120, an adjustment device 130 and an image-processing device 140. It should be noted that FIG. 1 is one embodiment of the present invention, but the present invention is not limit thereto. The system for detecting the electronic components 100 also includes other components.

In the embodiment, the light-source device 110, the photography device 120 and the adjustment device 130 are configured on a moving carrier, and the image-processing device 140 is configured on a machine station. The moving carrier is, for example, a robotic arm. In addition, the system for detecting the electronic components 100 further includes a controlling device (not shown) to control the light-source device 110, the photography device 120 and the adjustment device 130.

The light-source device 110 is configured to generate a light that illuminates at least one pin 151 of a first electronic component 150 at different rotation angles. In the embodiment, the light may be a visible light or a non-visible light, such as X-ray, ultraviolet light, infrared light or electromagnetic wave, but the present invention is not limited thereto.

The photography device 120 is disposed in parallel with and opposite to the light-source device 110. That is, the light generated by the light-source device 110 may illuminate the photography device 120 in parallel. The photography device 120 may be configured to sense the light and generate a plurality of first images and a plurality of second images corresponding to the pin 151 of the first electronic component (150) at the different rotation angles. In the embodiment, the electronic component 150 is located between the photography device 120 and the light-source device 110.

The adjustment device 130 is coupled to the photography device 120 and the light-source device 110. The adjustment device 130 is configured to adjust the photography device 120 and the light-source device 110 to a first height and a second height and rotate the photography device 120 and the light-source device 110. That is, the adjustment device 130 may adjust the photography device 120 and the light-source device 110 to the first height. Then, the adjustment device 130 may rotate the photography device 120 and the light-source device 110, so that the photography device 120 may generate a plurality of first images corresponding to the pin 151 of the first electronic component 150 at different rotation angles, wherein the first images correspond to the first height.

Afterward, the adjustment device 130 may adjust the photography device 120 and the light-source device 110 to the second height. Then, the adjustment device 130 may rotate the photography device 120 and the light-source device 110, so that the photography device 120 may generate a plurality of second images corresponding to the pin 151 of the first electronic component 150 at the different rotation angles, wherein the second images correspond to the second height. In the embodiment, the adjustment device 130 may rotate the photography device 120 and the light-source device 110 in sequence according to a fixed angle, so that the photography device 120 may generate the images corresponding to different angles. In addition, the fixed angle is, for example, one degree, two degrees, three degrees, etc., but not intended to limit the present invention. The user may adjust the fixed angle according to the requirements thereof.

Furthermore, the adjustment device 130 may include a height adjustment device 131 and a rotating device 132. The rotating device 132 is coupled to the height adjustment device 131. The photography device 120 and the light-source device 110 may be disposed on the rotating device 132. The height adjustment device 131 is configured to adjust the photography device 120 and the light-source device 110 to different heights. The rotating device 132 is configured to rotate the photography device 120 and the light-source device 110 to different angles.

The image-processing device 140 is coupled to the photography device 120 and receives the first images and the second images. The image-processing device 140 calculates first feature information of at least pin 151 of the first electronic component 150 according to the first images and the second images. That is, after the image-processing device 140 receives the first images, the image-processing device 140 may obtain coordinate positions of the pins 151 of the first electronic component 150 corresponding to the first height according to a light intensity distribution of each of the first images. Then, after the image-processing device 140 receives the second images, the image-processing device 140 may obtain coordinate positions of the pins 151 of the first electronic component 150 corresponding to the second height according to a light intensity distribution of each of the second images. Afterward, the image-processing device 140 calculates the first feature information of the pin 151 of the first electronic components 150 according to the coordinate positions of the pin 151 of the first electronic component 150 corresponding to the first height and the second height.

Then, the image-processing device 140 may analyze the state of the pin 151 of the first electronic component 150 according to the first feature information. That is, the image-processing device 140 determines whether the pin 151 of the first electronic component 150 is offset, skewed, etc., according to feature values of the first feature information. In the embodiment, the first feature information may include the feature values, such as a pin offset quantity, a yaw angle, a pin pitch tolerance, or a skew angle, etc.

Figure 2A:
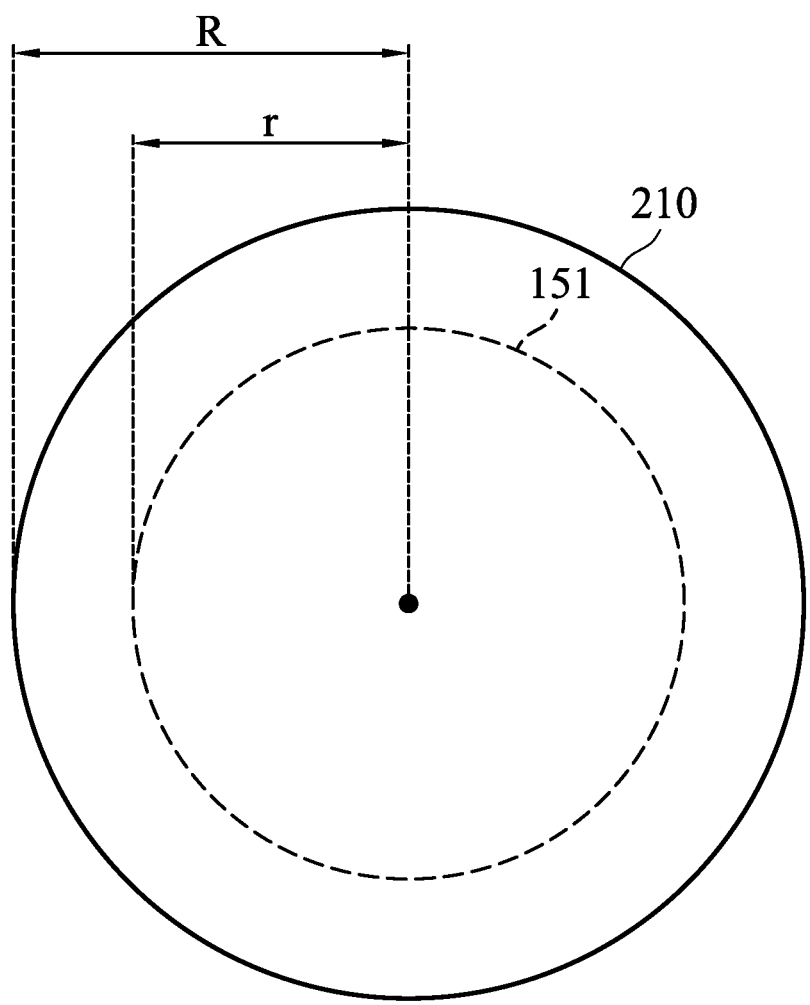
FIGS. 2A and 2B show a schematic view of a corresponding relationship of a pin and a through hole according to an embodiment of the present invention.
Figure 2B:
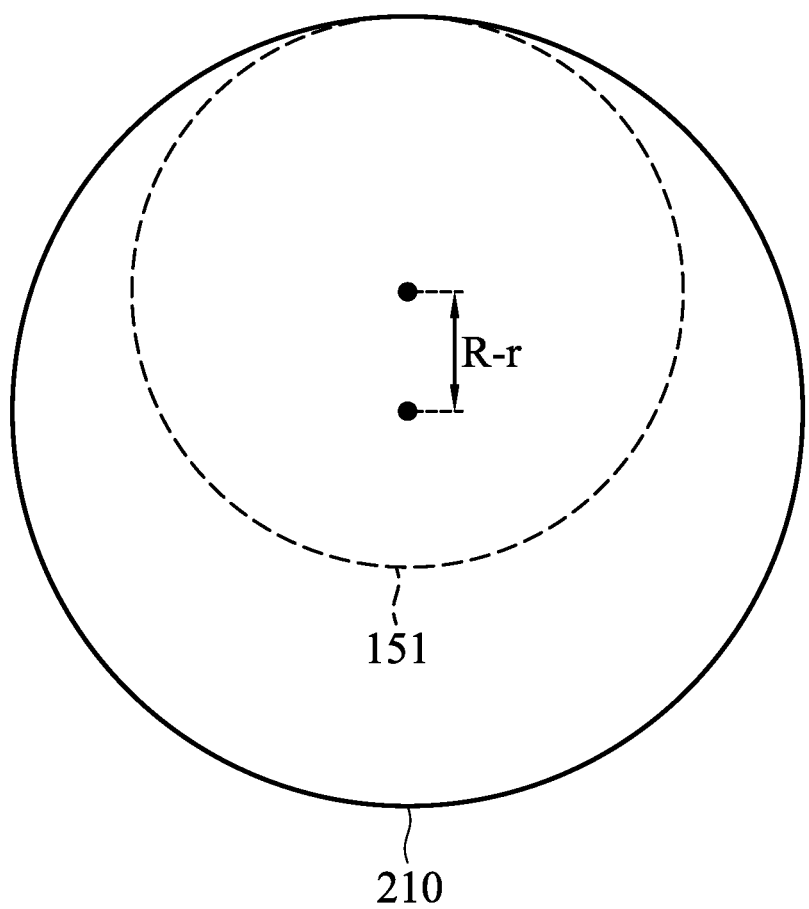

Furthermore, when the image-processing device 140 obtains the first feature information, the image-processing device 140 further compares a feature value of the first feature information with a predetermined value. For example, the feature value of the first information as the offset quantity, as shown in FIG. 2A and FIG. 2B. The reference number "151" is the pin. The reference number "210" is a through hole of a circuit board corresponding to the pin 151. The reference number "r" is a radius of the pin 151. The reference number "R" is a radius of the through hole 210. The reference number "R-r" is a predetermined value. That is, the image-processing device 140 may determine whether the feature value of the first feature information exceeds the predetermined value to determine whether the pin 151 of the first electronic component 151 needs to be corrected.

When the feature value of the first feature information does not exceed the predetermined value "R-r", it indicates that the pin 151 is not offset or yawed (as shown in FIG. 2A), or the pin 151 is offset or yawed but the offset amount or the yawed degree is within the predetermined value "R-r" (as shown in FIG. 2B). Accordingly, the image-processing device 140 determines that the state of the pin 151 of the first electronic component 150 is normal and does not need to be corrected. Therefore, the pins 151 of the first electronic component 150 may be accurately inserted into the through holes 210 on the circuit board.

When the feature value of the first feature information exceeds the predetermined value "R-r", i.e., the numerical value of the feature value of the first feature information is greater than the predetermined value "R-r", it indicates that the pin 151 is offset or yawed and the offset amount or the yawed degree exceeds the predetermined value "R-r". Accordingly, the image-processing device 140 uses the feature value of the first feature information as a correction value, and outputs the correction value. Therefore, the user may correct the pin 151 of the first electronic component 150 through the correction value, so that the position of the pin 151 may be corrected to a normal position, and then the pin 151 of the first electronic component 150 may be accurately inserted into the through hole 210 on the circuit board.

For convenience of explanation, pin coordinates of the electronic component are denoted by $P_{k,m,n}$, wherein k is the electronic component number, m is the pin number, n is the pin height position. A total number of detected electronic components is denoted by K, and the number of pins of an electronic component is denoted by M. The pins of the electronic component are detected at at least two different heights (N≥2) to obtain pin coordinates of K×M×N, wherein 1≤k≤K, 1≤m≤M and 1≤n≤N.

Figure 3:
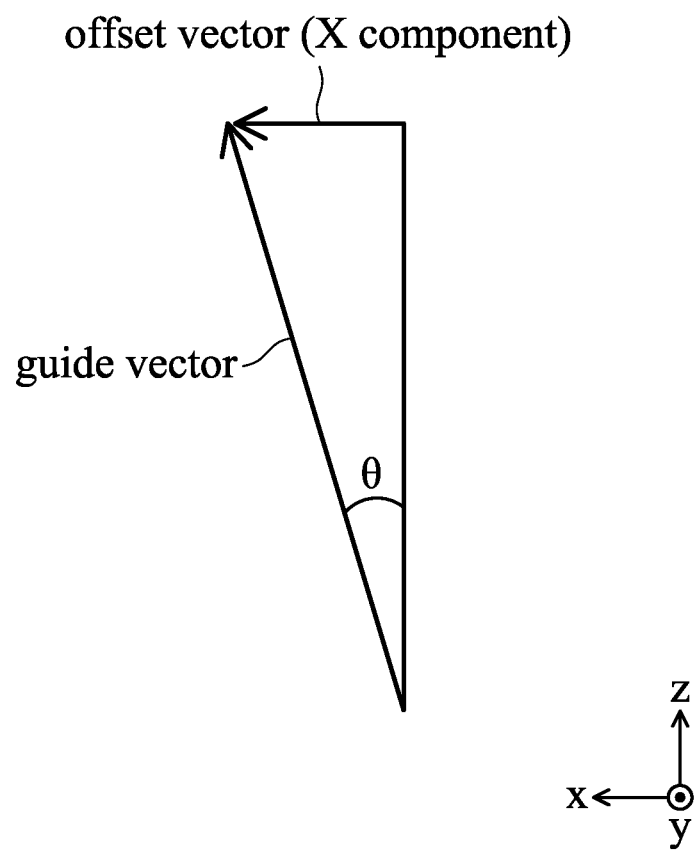
FIG. 3 shows a schematic view of a corresponding relationship of a guide vector, an offset vector, an offset quantity and a yaw angle according to an embodiment of the present invention.

The yaw of the pin 151 may be evaluated by the offset quantity, and the offset quantity is defined as follows. Firstly, a guide vector of the pin 151 is defined as a coordinate difference value of one pin at two different height positions (i.e., the first height and the second height). In the embodiment, the two different heights are exemplified by n=1 and n=N, but the present invention is not limited thereto. An offset vector is a component of the guide vector on the x-y plane, wherein z-axis is a vertical direction. The offset quantity is a length of the offset vector, as shown in FIG. 3. In the embodiment, the guide vector may be denoted by $$\overrightarrow{P_{k,m}} = P_{k,m,1} - P_{k,m,N} = \begin{bmatrix} x \\ y \\ z \end{bmatrix},$$

the offset vector may be denoted by $$\overrightarrow{S_{k,m}} = \begin{bmatrix} 1 & 0 & 0 \\ 0 & 1 & 0 \end{bmatrix} \begin{bmatrix} x \\ y \\ z \end{bmatrix} = \begin{bmatrix} x \\ y \end{bmatrix},$$

and the offset quantity may be denoted by $$X_{k,m} = \|\overrightarrow{S_{k,m}}\|.$$

A difference between the pin coordinate of one pin at two different height positions is calculated to obtain the guide vector of the pin. The yaw angle is the angle between the guide vector of the pin and the z-axis, wherein the z-axis is the vertical direction. The yaw angle may be shown as "θ" in FIG. 3. The guide vector may be denoted by $$\overrightarrow{P_{k,m}} = P_{k,m,1} - P_{k,m,N},$$

a unit vector of the z-axis may be denoted by $\vec{z}$, and the yaw angle may be denoted by $$\theta_{k,m} = \cos^{-1}\left(\frac{\overrightarrow{P_{k,m}} \cdot \vec{z}}{\|\overrightarrow{P_{k,m}}\|}\right).$$

A definition of the pin pitch tolerance is a difference between a measurement pin pitch and a standard pin pitch. That is, a coordinate difference value of two different pins on the electronic component at the same height is calculated to obtain the pin pitch. In addition, a length of the pin pitch vector of the tip (n=1) of the pin is defined as the measurement pin pitch, and a length of the pin pitch vector of the root (n=N) of the pin is defined as the standard pin pitch, wherein the two different pins are denoted by $m_i$ and $m_j$, and i≠j. In the embodiment, the pin pitch vector may be denoted by $$\overrightarrow{P_{k,m_i \to m_j,n}} = P_{k,m_i,n} - P_{k,m_j,n},$$

and the pin pitch tolerance may be denoted by $$Y_{k,m_i \to m_j} = \|\overrightarrow{P_{k,m_i \to m_j,1}}\| - \|\overrightarrow{P_{k,m_i \to m_j,N}}\|.$$

The skew angle is used to represent a twisting degree of a pair of pins. The skew angle is defined as an angle between the two different vectors located at the pin pitch vector (n=1) of the tip of the pin and the pin pitch vector (n=N) of the root of the pin, wherein the two different pins are denoted by $m_i$ and $m_j$, and i≠j. In the embodiment, the pin pitch vector is denoted by $$\overrightarrow{P_{k,m_i \to m_j,n}} = P_{k,m_i,n} - P_{k,m_j,n} = \begin{bmatrix} x_{k,m_i \to m_j,n} \\ y_{k,m_i \to m_j,n} \\ z_{k,m_i \to m_j,n} \end{bmatrix},$$

and the skew angle is denoted by $$\varphi_{k,m_i \to m_j,n} = \cos^{-1}\left(\frac{\begin{bmatrix} x_{k,m_i \to m_j,1} \\ y_{k,m_i \to m_j,1} \\ z_{k,m_i \to m_j,1} \end{bmatrix}^T \begin{bmatrix} x_{k,m_i \to m_j,N} \\ y_{k,m_i \to m_j,N} \\ z_{k,m_i \to m_j,N} \end{bmatrix}}{\left\|\begin{bmatrix} x_{k,m_i \to m_j,1} \\ y_{k,m_i \to m_j,1} \\ z_{k,m_i \to m_j,1} \end{bmatrix}\right\| \left\|\begin{bmatrix} x_{k,m_i \to m_j,N} \\ y_{k,m_i \to m_j,N} \\ z_{k,m_i \to m_j,N} \end{bmatrix}\right\|}\right).$$

In foregoing embodiments, the cited example uses two heights adjusted by the adjustment device 130, i.e., the first height and the second height, but the present invention is not limited thereto. In some embodiments, the adjustment device 130 may further adjust three or more heights, so that the photography device 120 further photographs the images corresponding to different heights, and transmits the image to the image-processing device 140 for analyzing. Therefore, the accuracy of detection may be increased.

In addition, the cited example uses one electronic component, i.e., the first electronic component 150, but the present invention is not limit thereto. The system for detecting the electronic components 100 may detect two or more electronic components. Furthermore, the system for detecting the electronic components 100 may detect the pin of the electronic component and further analyze a cutting tool. An example will be described below.

After the system for detecting the electronic components 100 obtains the first images and the second images corresponding to the first electronic components 150, the system for detecting the electronic components 100 may detect a second electronic component 170. That is, the second electronic component 170 may be disposed between the light-source device 110 and the photography device 120, so that the light-source device 110 may illuminate at least one pin 171 of the second electronic component 170 at different rotation angles. In addition, the photography device 120 further senses the light and generates a plurality of third images and a plurality of fourth images corresponding to the pin 171 of the second electronic component 170 at the different rotation angles.

The adjustment device 130 adjusting the photography device 130 and the light-source device to the first height and the second height may refer to the foregoing description, and the description thereof is not repeated herein. In addition, the third images correspond to the first height, and the fourth images correspond to the second height. That is, the first images and the third images correspond to the first height, and the second images and the fourth image correspond to the second height.

Then, the image-processing device 140 further receives the third images and the fourth images. The image-processing device 140 calculates second feature information of the pin 171 of the second electronic component 170 according to the third images and the fourth images. In the embodiment, the calculation of the second feature information may refer to the foregoing calculation of the first feature information, and the description thereof is not repeated herein. In addition, the image-processing device 140 may also analyze the state of the pin 171 of the second electronic component 170 according to the second feature information. The analysis of the pin 171 of the second electronic component 170 may refer to the foregoing analysis of the pin 151 of the first electronic component 150, and the description thereof is not repeated herein. In the embodiment, the first electronic component 150 and the second electronic component 170 are the same type of electronic components.

After the image-processing device 140 obtains the first feature information and the second feature information, the image-processing device 140 may analyze the state of a cutting tool according to the first feature information and the second feature information. That is, the image-processing device 140 determines an abrasion degree of the cutting tool according to the feature values of the first feature information and the second feature information, i.e., the image-processing device 140 determines whether a knife tool of the cutting tool needs to be replaced. In the embodiment, the first feature information and the second feature information respectively include a pin offset quantity, a yaw angle, a pin pitch tolerance, or a skew angle.

Furthermore, after the image-processing device 140 obtains the first feature information and the second feature information, the image-processing device 140 further calculates the first feature information and the second feature information to generate a statistical value, and analyzes the state of the cutting tool. That is, the image-processing device 140 may determine the abrasion degree of the cutting tool according to the statistical value.

Then, the image-processing device 140 compares the statistical value with a predetermined allowable value. That is, the image-processing device 140 may determine whether the statistical value exceeds than the predetermined allowable value to determine whether the knife tool of the cutting tool needs to be maintained or replaced.

When the statistical value does not exceed the predetermined allowable value, it indicates that the abrasion degree of the cutting tool is still within the allowable value. Accordingly, the image-processing device 140 determines that the state of the cutting tool is normal and does not need maintenance or replacement. Therefore, the cutting tool does not cause the abnormal yaw of the pin after the pin of the electronic component is cut.

When the statistical value exceeds the predetermined allowable value, it indicates that the abrasion degree of the cutting tool already exceeds the range of the allowable value. Accordingly, the image-processing device 140 generates a warning message. The warning message may generate a voice through an audio device (such as a buzzer or a speaker), or generate a warning light through an illumination device (such as a light emitting diode). Therefore, the user may know that the abrasion degree of the cutting tool already exceeds the allowable value through the warning message and needs to maintain or replace the knife tool of the cutting tool, so as to avoid the abnormal yaw of the pin.

The foregoing statistical value may include a calculation of an average and a standard deviation of the offset quantity, so as to serve as the basis for determining the maintenance warning of the cutting tool. The statistical value may include a count and an analysis of a plurality of pins of the same electronic component, wherein the number of pins is M' and $2 \leq M' \leq M$. In addition, The statistical value may include a count and an analysis of the same pin of a plurality of electronic components, wherein the number of electronic components is K' and $2 \leq K' \leq K$. In the embodiment, the average of the offset quantity of the pins of the same electronic component may be denoted by $$\mu_k = \frac{1}{M'} \sum_m X_{k,m},$$

the average of the offset quantity of total offset vector of the pins of the same electronic component may be denoted by $$\mu'_k = \frac{1}{M'} \left\| \sum_m \overline{S_{k,m}} \right\|,$$

and the standard deviation of the offset quantity of the pins of the same electronic component may be denoted by $$\sigma_k = \left(\frac{1}{M'}\sum_m (X_{k,m} - \mu_k)^2\right)^{\frac{1}{2}}.$$

The average of the offset quantity of the same pin of the electronic components may be denoted by $$\mu_m = \frac{1}{K'}\sum_k X_{k,m},$$

the average of the offset quantity of total offset vector of the same pin of the electronic components may be denoted by $$\mu_{\hat{m}} = \frac{1}{K'}\left\|\sum_k \overrightarrow{S_{k,m}}\right\|,$$

and the standard deviation of the offset quantity of the same pin of the electronic components may be denoted by $$\sigma_m = \left(\frac{1}{K'}\sum_k (X_{k,m} - \mu_m)^2\right)^{\frac{1}{2}}.$$

The statistical value may also include a calculation of an average and a standard deviation of the yaw angle, to serve as the basis for determining the maintenance warning of the cutting tool. The statistical value may include a count and an analysis of a plurality of pins of the same electronic component, wherein the number of pins is M' and $2 \leq M' \leq M$. In addition, The statistical value may include a count and an analysis of the same pin of a plurality of electronic components, wherein the number of electronic components is K' and $2 \leq K' \leq K$. In the embodiment, the average of the yaw angle of the pins of the same electronic component may be denoted by $$\mu_k = \frac{1}{M'}\sum_m \theta_{k,m},$$

the average of the yaw angle of the total guide vector of the pins of the same electronic component may be denoted by $$\mu_{\tilde{k}} = \cos^{-1}\left(\frac{\left(\frac{1}{M'}\left\|\sum_m \overrightarrow{P_{k,m}}\right\|\right) \cdot \vec{z}}{\left\|\frac{1}{M'}\left\|\sum_m \overrightarrow{P_{k,m}}\right\|\right\|}\right),$$

and the standard deviation of the yaw angle of the pins of the same electronic component may be denoted by $$\sigma_k = \left(\frac{1}{M'}\sum_m (\theta_{k,m} - \mu_k)^2\right)^{\frac{1}{2}}.$$

The average of the yaw angle of the same pin of the electronic components may be denoted by $$\mu_m = \frac{1}{K'}\sum_k \theta_{k,m},$$

the average of the yaw angle of total guide vector of the same pin of the electronic components may be denoted by and the $$\mu_{\hat{m}} = \cos^{-1}\left(\frac{\left(\frac{1}{K'}\left\|\sum_k \overrightarrow{P_{k,m}}\right\|\right) \cdot \vec{z}}{\left\|\frac{1}{K'}\left\|\sum_m \overrightarrow{P_{k,m}}\right\|\right\|}\right),$$

standard deviation of the yaw angle of the same pin of the electronic components may be denoted by $$\sigma_m = \left(\frac{1}{K'}\sum_k (\theta_{k,m} - \mu_m)^2\right)^{\frac{1}{2}}.$$

The statistical value may also include a calculation of an average of the pin pitch tolerance, so as to serve as the basis for determining the maintenance warning of the cutting tool. The statistical value may include a count and an analysis of a plurality of pin pitches of the same electronic component, wherein the number of pin pitches is M' and $2 \leq M' \leq M(M-1)/2$. In addition, The statistical value may include a count and an analysis of the same pin pitch of a plurality of electronic components, wherein the number of electronic components is K' and $2 \leq K' \leq K$. In the embodiment, the average of the pin pitch tolerance of the pin pitches of the same electronic component may be denoted by $$\mu_k = \frac{1}{M'}\sum_m Y_{k,m_i \to m_j},$$

and the standard deviation of the pin pitch deviation of the pin pitches of the same electronic component may be denoted by $$\sigma_k = \left(\frac{1}{M'}\sum_m (Y_{k,m_i \to m_j} - \mu_k)^2\right)^{\frac{1}{2}}.$$

The average of the pin pitch tolerance of the same pin pitch of the electronic components may be denoted by $$\mu_{m_i \to m_j} = \frac{1}{K'} \sum_k Y_{k, m_i \to m_j},$$

and the standard deviation of the pin pitch tolerance of the same pin pitch of the electronic components may be denoted by $$\sigma_{m_i \to m_j} = \left( \frac{1}{K'} \sum_k (Y_{k, m_i \to m_j} - \mu_{m_i \to m_j})^2 \right)^{\frac{1}{2}}.$$

The statistical value may also include a calculation of an average of the skew angle, so as to serve as the basis for determining the maintenance warning of the cutting tool. The statistical value may include a count and an analysis of a plurality of positions of the same electronic component, wherein the number of positions is M' and 2≤M'≤M(M−1)/2. In addition, The statistical value may include a count and an analysis of the same position of a plurality of electronic components, wherein the number of electronic components is K' and 2≤K'≤K.

In the embodiment, the average of the skew angle of the positions of the same electronic component may be denoted by $$\mu_k = \frac{1}{M'} \sum_m \varphi_{k, m_i \to m_j},$$

and the standard deviation of the skew angle of the positions of the same electronic component may be denoted by $$\sigma_k = \left( \frac{1}{M'} \sum_m (\varphi_{k, m_i \to m_j} - \mu_k)^2 \right)^{\frac{1}{2}}.$$

The average of the skew angle of the same position of the electronic components may be denoted by $$\mu_{m_i \to m_j} = \frac{1}{K'} \sum_k \varphi_{k, m_i \to m_j},$$

and the standard deviation of the skew angle of the same position of the electronic components may be denoted by $$\sigma_{m_i \to m_j} = \left( \frac{1}{K'} \sum_k (\varphi_{k, m_i \to m_j} - \mu_{m_i \to m_j})^2 \right)^{\frac{1}{2}}.$$

In foregoing embodiments, the cited example uses two heights adjusted by the adjustment device 130, i.e., the first height and the second height, but the present invention is not limited thereto. In some embodiments, the adjustment device 130 may further adjust three or more heights, so that the photography device 120 further photographs the images corresponding to different heights, and transmits the images to the image-processing device 140 for analyzing. Therefore, the accuracy of detection may be increased. In addition, the cited example uses two electronic components, i.e., the first electronic component 150 and the second electronic component 170, but the present invention is not limit thereto. The system for detecting the electronic components 100 may detect three or more electronic components. Therefore, the analytical accuracy of the state of the cutting tool may be further increased.

Figure 4:
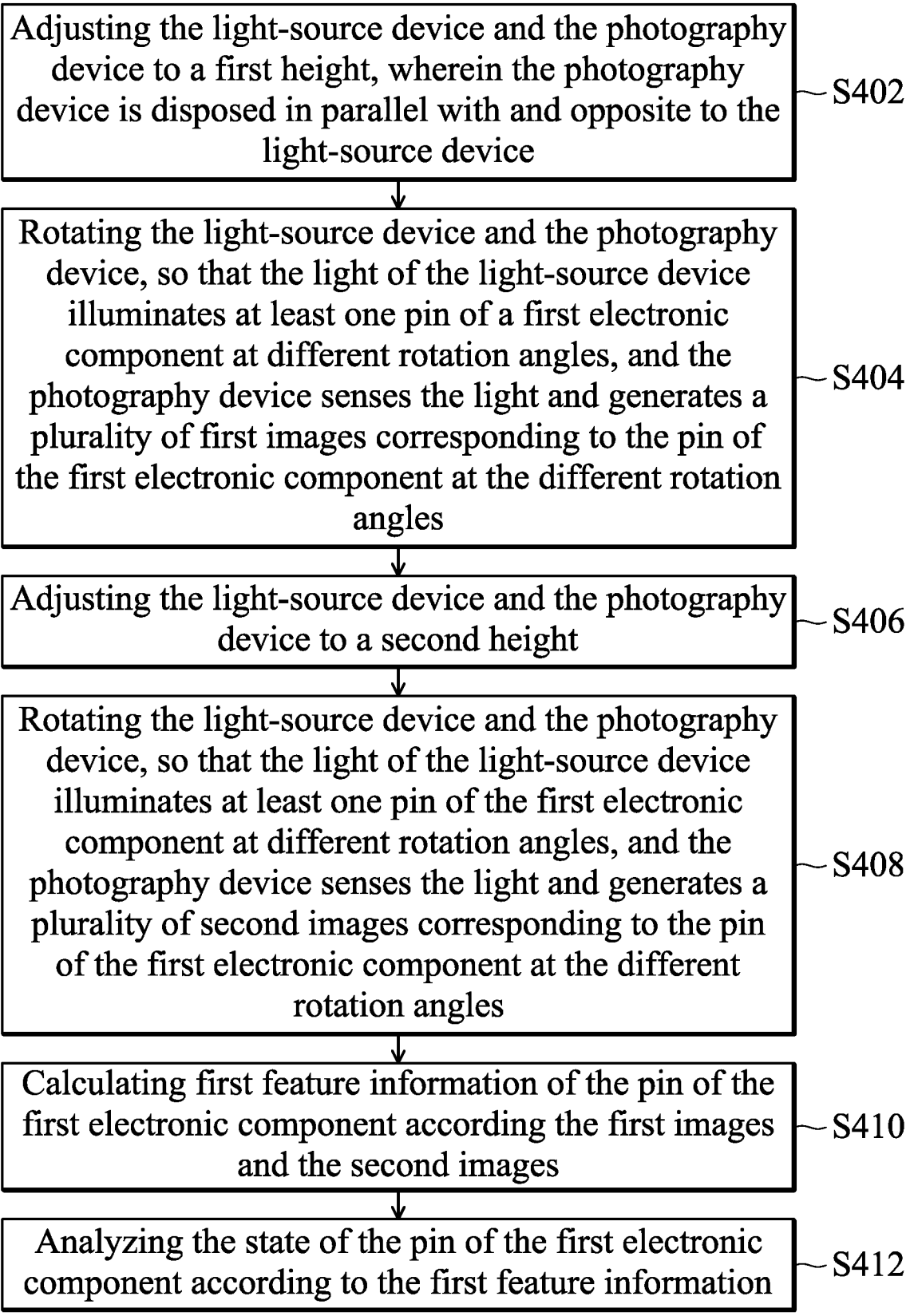
FIG. 4 shows a flowchart of a method for detecting electronic components according to an embodiment of the present invention.

FIG. 4 shows a flowchart of a method for detecting electronic components according to an embodiment of the present invention. In step S402, the method involves adjusting the light-source device and the photography device to a first height, wherein the photography device is disposed in parallel with and opposite to the light-source device. In step S404, the method involves rotating the light-source device and the photography device, so that the light of the light-source device illuminates at least one pin of a first electronic component at different rotation angles, and the photography device senses the light and generates a plurality of first images corresponding to the pin of the first electronic component at the different rotation angles.

In step S406, the method involves adjusting the light-source device and the photography device to a second height. In step S408, the method involves rotating the light-source device and the photography device, so that the light of the light-source device illuminates at least one pin of the first electronic component at different rotation angles, and the photography device senses the light and generates a plurality of second images corresponding to the pin of the first electronic component at the different rotation angles.

In step S410, the method involves calculating first feature information of the pin of the first electronic component according the first images and the second images. In step S412, the method involves analyzing the state of the pin of the first electronic component according to the first feature information.

Figure 5:
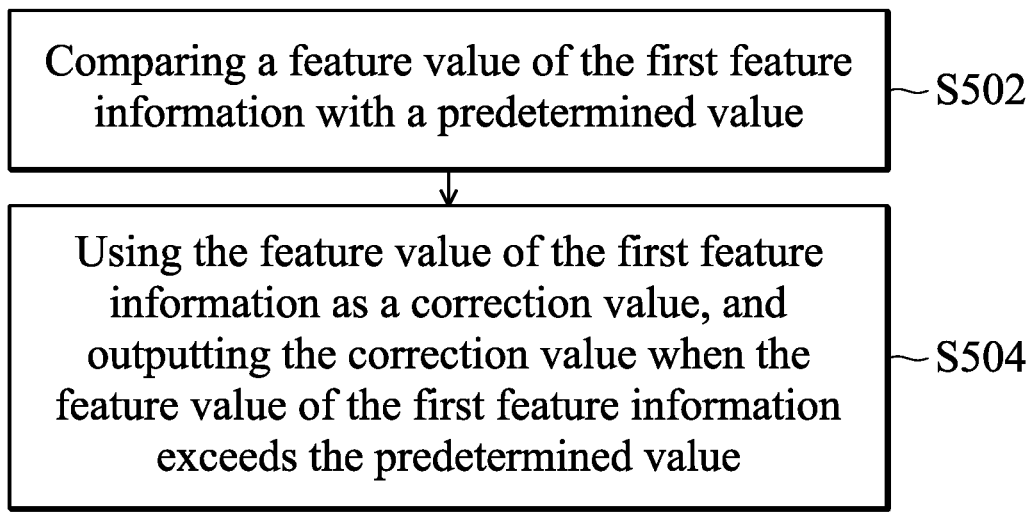
FIG. 5 shows a detailed flowchart of step S412 in FIG. 4.

FIG. 5 shows a detailed flowchart of step S412 in FIG. 4. In step S502, the method involves comparing a feature value of the first feature information with a predetermined value. In step S504, the method involves using the feature value of the first feature information as a correction value, and outputting the correction value when the feature value of the first feature information exceeds the predetermined value.

Figure 6A:
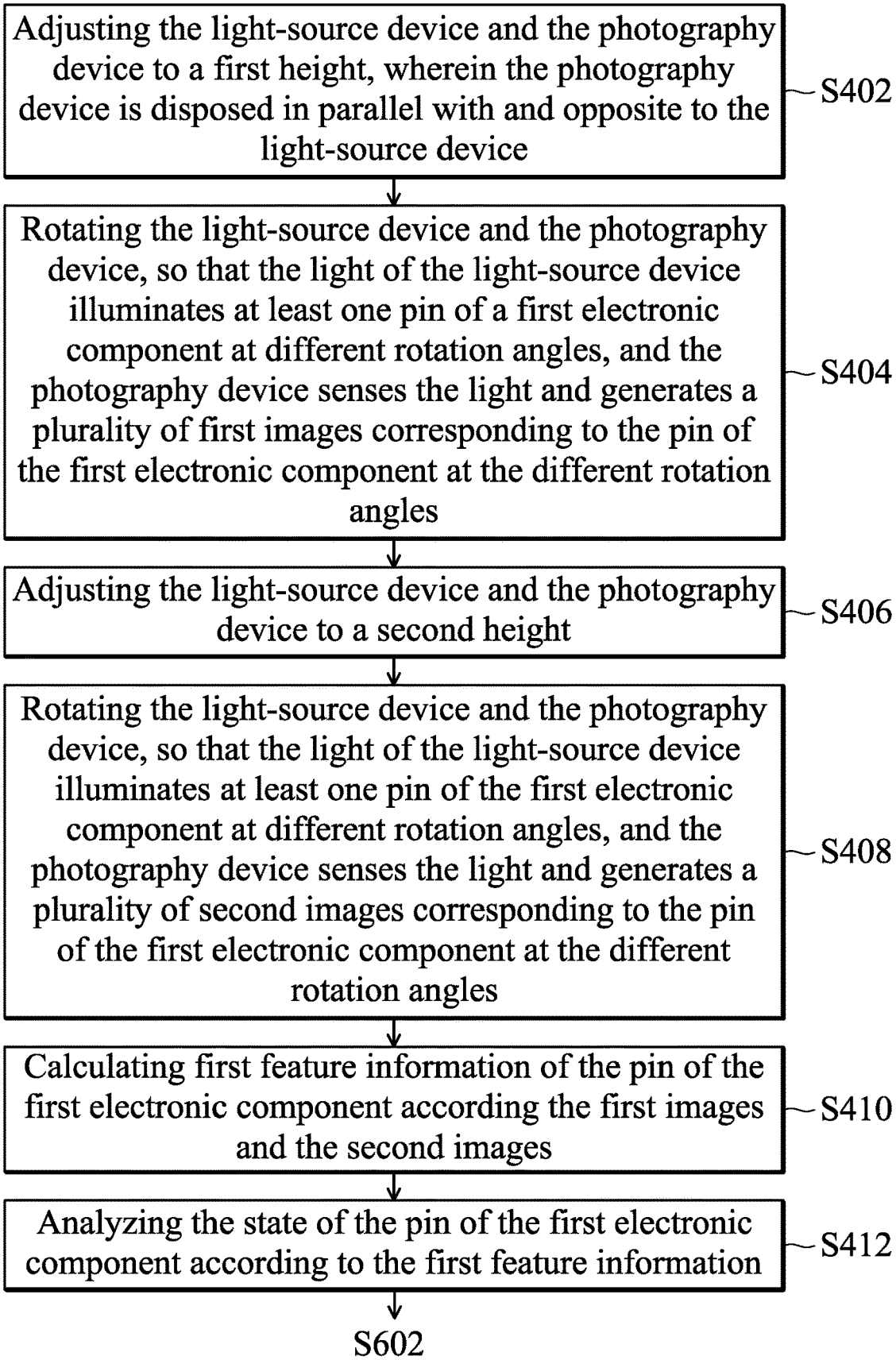
FIGS. 6A and 6B show a flowchart of a method for detecting electronic components according to another embodiment of the present invention.
Figure 6B:
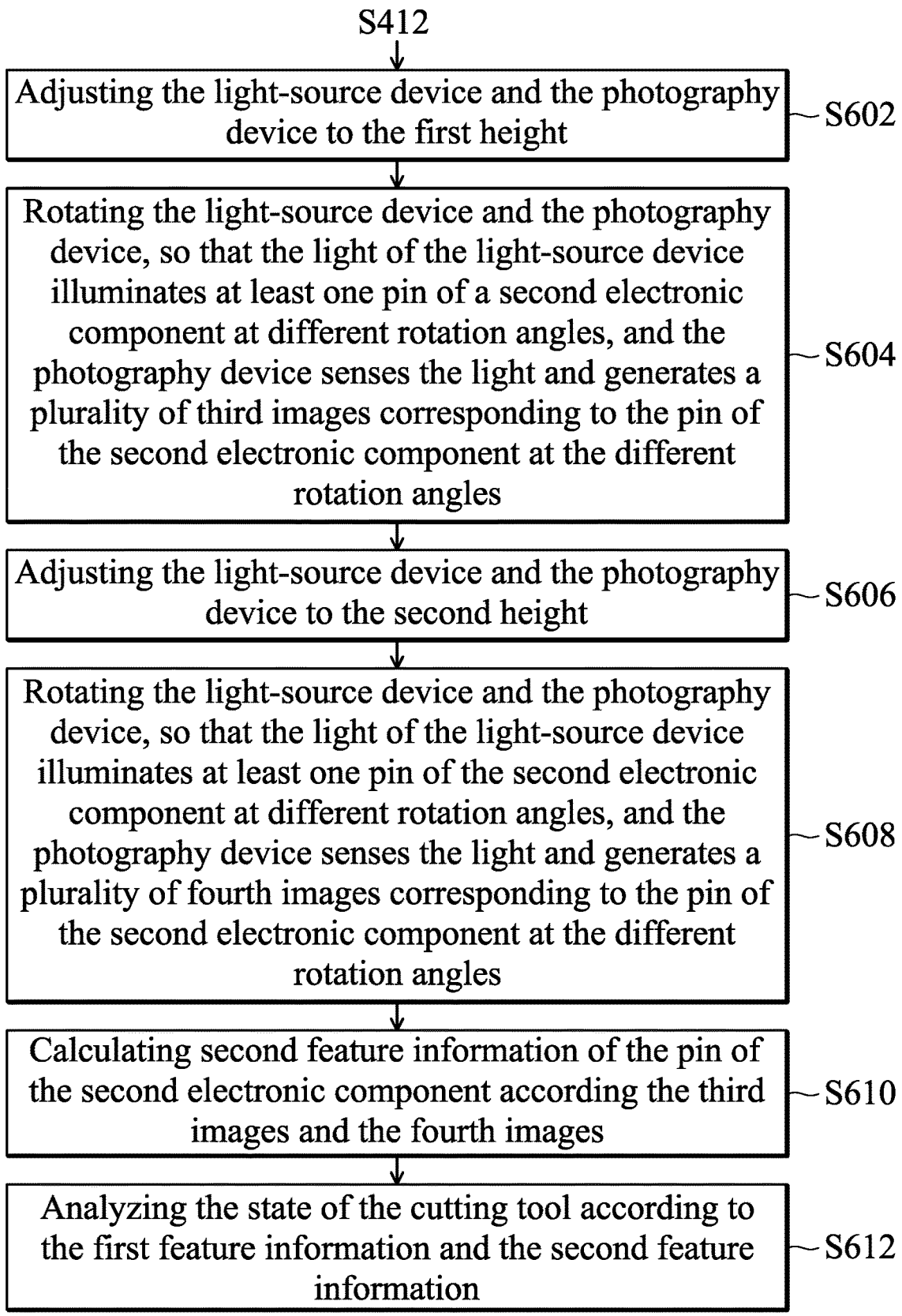

FIGS. 6A and 6B show a flowchart of a method for detecting electronic components according to another embodiment of the present invention. In the embodiment, the method for detecting the electronic components includes the steps S402 to S412 in FIG. 4 (as shown in FIG. 6A) and steps S602 to S612 (as shown in FIG. 6B). In step S602, the method involves adjusting the light-source device and the photography device to the first height. In step S604, the method involves rotating the light-source device and the photography device, so that the light of the light-source device illuminates at least one pin of a second electronic component at different rotation angles, and the photography device senses the light and generates a plurality of third images corresponding to the pin of the second electronic component at the different rotation angles.

In step S606, the method involves adjusting the light-source device and the photography device to the second height. In step S608, the method involves rotating the light-source device and the photography device, so that the light of the light-source device illuminates at least one pin of the second electronic component at different rotation angles, and the photography device senses the light and generates a plurality of fourth images corresponding to the pin of the second electronic component at the different rotation angles.

In step S610, the method involves calculating second feature information of the pin of the second electronic component according the third images and the fourth images. In step S612, the method involves analyzing the state of the cutting tool according to the first feature information and the second feature information.

Figure 7:
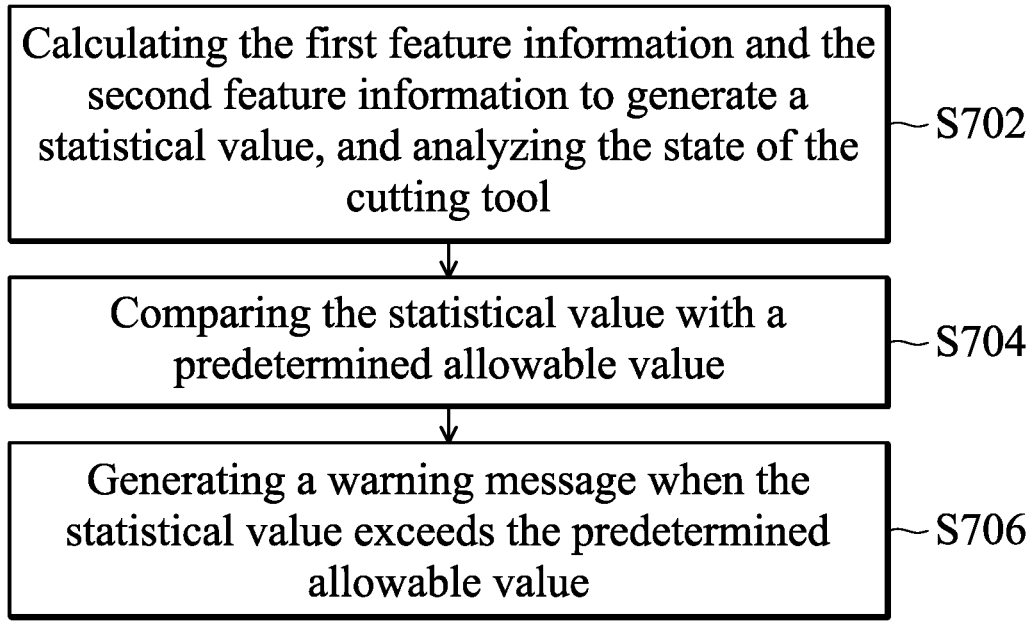
FIG. 7 shows a detailed flowchart of step S612 in FIG. 6B.

FIG. 7 shows a detailed flowchart of step S612 in FIG. 6B. In step S702, the method involves calculating the first feature information and the second feature information to generate a statistical value, and analyzing the state of the cutting tool. In step S704, the method involves comparing the statistical value with a predetermined allowable value. In step S706, the method involves generating a warning message when the statistical value exceeds the predetermined allowable value.

In summary, according to the system and method for detecting the electronic components of the present invention, the light-source device and the photography device are respectively adjusted to the first height and the second height and rotated, so that the light of the light-source device illuminates at least one pin of the first electronic component at different rotation angles. The photography device senses the light and generates the first images and the second images of the pin of the first electronic component corresponding to the different rotation angles. The first feature information of the pin of the first electronic component is calculated according to the first images and the second image, and the state of the pin of the first electronic component is analyzed according to the first feature information. Therefore, the state of the pin of the electronic component may be effectively detected to serve as the basis for determining whether the pin needs to be corrected.

In addition, the light-source device and the photography device are further adjusted to the first height and the second height and rotated, so that the light of the light-source device illuminates at least one pin of the second electronic component at different rotation angles. The photography device senses the light and generates the third images and the fourth images of the pin of the second electronic component corresponding to the different rotation angles. The second feature information of the pin of the second electronic component is calculated according to the third images and the fourth images, and the state of the cutting tool is analyzed according to the first feature information and the second feature information. Therefore, the state of the cutting tool may be also effectively analyzed to serve as the basis for deciding whether the cutting tool needs maintenance or replacement, thereby increasing the convenience of use.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for detecting electronic components, comprising:
   a light-source device, configured to generate a light to illuminate at least one pin of a first electronic component at different rotation angles;
   a photography device, disposed in parallel with and opposite to the light-source device, and configured to sense the light and generate a plurality of first images and a plurality of second images corresponding to the pin of the first electronic component at different rotation angles;
   an adjustment device, coupled to the photography device and the light-source device, and configured to adjust the photography device and the light-source device to a first height and a second height and rotate the photography device and the light-source device, wherein the first images correspond to the first height and the second images correspond to the second height; and
   an image-processing device, coupled to the photography device, and configured to receive the first images and the second images, calculate first feature information of the pin of the first electronic component according the first images and the second images, and analyze a state of the pin of the first electronic component according to the first feature information,
   wherein the light-source device further illuminates at least one pin of a second electronic component at different rotation angles; the photography device further senses the light and generates a plurality of third images and a plurality of fourth images corresponding to the pin of the second electronic component at the different rotation angles; the adjustment device further adjusts the photography device and the light-source device to the first height and the second height and rotate the photography device and the light-source device, so that the third images correspond to the first height and the fourth images correspond to the second height the image-processing device further receives the third images and the fourth images, calculates second feature information of the pin of the second electronic component according the third images and the fourth images, and analyzes a state of a cutting tool according to the first feature information and the second feature information.

2. The system for detecting the electronic components as claimed in claim 1, wherein the image-processing device further compares a feature value of the first feature information with a predetermined value, and when the feature value of the first feature information exceeds the predetermined value, the image-processing device uses the feature value of the first feature information as a correction value, and outputs the correction value.

3. The system for detecting the electronic components as claimed in claim 1, wherein the first electronic component and the second electronic component are the same type of electronic components.

4. The system for detecting the electronic components as claimed in claim 1, wherein the image-processing device further calculates the first feature information and the second feature information to generate a statistical value and analyzes a state of the cutting tool, and compares the statistical value with a predetermined allowable value, and when the statistical value exceeds the predetermined allowable value, the image-processing device generates a warning message.

5. The system for detecting the electronic components as claimed in claim 1, wherein the first feature information and the second feature information respectively comprise a pin offset quantity, a yaw angle, a pin pitch tolerance, or a skew angle.

6. A method for detecting electronic components, comprising steps of:
- adjusting a light-source device and a photography device to a first height, wherein the photography device is disposed in parallel with and opposite to the light-source device;
- rotating the light-source device and the photography device, so that a light of the light-source device illuminates at least one pin of a first electronic component at different rotation angles, and the photography device senses the light and generates a plurality of first images corresponding to the pin of the first electronic component at different rotation angles;
- adjusting the light-source device and the photography device to a second height;
- rotating the light-source device and the photography device, so that the light of the light-source device illuminates the pin of the first electronic component at different rotation angles, and the photography device senses the light and generates a plurality of second images corresponding to the pin of the first electronic component at different rotation angles;
- calculating first feature information of the pin of the first electronic component according the first images and the second images;
- analyzing a state of the pin of the first electronic component according to the first feature information;
- adjusting the light-source device and the photography device to the first height;
- rotating the light-source device and the photography device, so that the light of the light-source device illuminates at least one pin of a second electronic component at different rotation angles, and the photography device senses the light and generates a plurality of third images corresponding to the pin of the second electronic component at the different rotation angles;
- adjusting the light-source device and the photography device to the second height;
- rotating the light-source device and the photography device, so that the light of the light-source device illuminates at least one pin of the second electronic component at different rotation angles, and the photography device senses the light and generates a plurality of fourth images corresponding to the pin of the second electronic component at the different rotation angles;
- calculating second feature information of the pin of the second electronic component according the third images and the fourth images; and
- analyzing a state of a cutting tool according to the first feature information and the second feature information.

7. The method for detecting the electronic components as claimed in claim 6, wherein the step of analyzing the state of the pin of the first electronic component according to the first feature information comprises steps of:
- comparing a feature value of the first feature information with a predetermined value; and
- using the feature value of the first feature information as a correction value, and outputting the correction value when the feature value of the first feature information exceeds the predetermined value.

8. The method for detecting the electronic components as claimed in claim 6, wherein the first second electronic component and the second electronic component are the same type of electronic components.

9. The method for detecting the electronic components as claimed in claim 6, wherein the step of analyzing the state of the cutting tool according to the first feature information and the second feature information comprises steps of:
- calculating the first feature information and the second feature information to generate a statistical value, and analyzing the state of the cutting tool;
- comparing the statistical value with a predetermined allowable value; and
- generating a warning message when the statistical value exceeds the predetermined allowable value.

10. The method for detecting the electronic components as claimed in claim 6, wherein the first feature information and the second feature information respectively comprise a pin offset quantity, a yaw angle, a pin pitch tolerance, or a skew angle.

* * * * *